(12) United States Patent
Frankowsky et al.

(10) Patent No.: US 6,707,746 B2
(45) Date of Patent: Mar. 16, 2004

(54) FUSE PROGRAMMABLE I/O ORGANIZATION

(75) Inventors: Gerd Frankowsky, Hoehenkirchen-Siegertsbrunn (DE); Barbara Vasquez, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,628

(22) Filed: Jul. 31, 2002

(65) Prior Publication Data

US 2003/0026159 A1 Feb. 6, 2003

Related U.S. Application Data

(60) Provisional application No. 60/308,998, filed on Jul. 31, 2001.

(51) Int. Cl.$^7$ ................................................. G11C 7/00
(52) U.S. Cl. ........................... 365/225.7; 365/189.05
(58) Field of Search ..................... 365/225.7, 189.05; 257/738

(56) References Cited

U.S. PATENT DOCUMENTS

| | | | |
|---|---|---|---|
| 4,987,325 A | | 1/1991 | Seo |
| 5,355,340 A | * | 10/1994 | Coker et al. ............. 365/225.7 |
| 6,141,273 A | | 10/2000 | Ku et al. |
| 6,225,836 B1 | | 5/2001 | Kitade |
| 6,356,958 B1 | * | 3/2002 | Lin ............................ 257/738 |

* cited by examiner

*Primary Examiner*—Huan Hoang
(74) *Attorney, Agent, or Firm*—Slater & Matsil, L.L.P.

(57) ABSTRACT

Circuitry using fuse and anti-fuse latches (62) for selecting the number of input/output channels (98, 109) after encapsulation is disclosed. The various embodiments allow conventional bond pads (14, 16, 18) to be used for initial selection of the number of input/output channels prior to encapsulation. However, by providing different selection signals (52, 54), the number of input/output channels may be changed by the user at any time after encapsulation. Other embodiments employ "enable" latch circuits (133,135) allow the initial selection by the users at any time after encapsulation, and then at least one more subsequent selection.

63 Claims, 4 Drawing Sheets

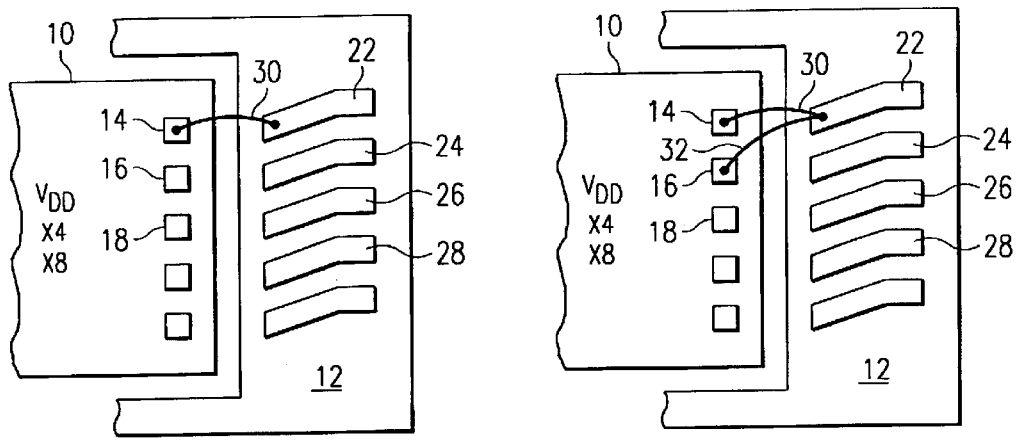
FIG. 1A
(PRIOR ART)
FIG. 1B
(PRIOR ART)
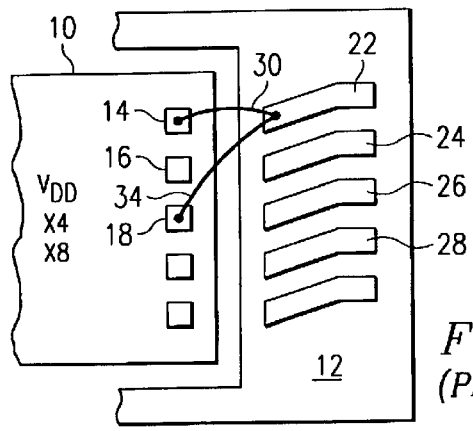
FIG. 1C
(PRIOR ART)
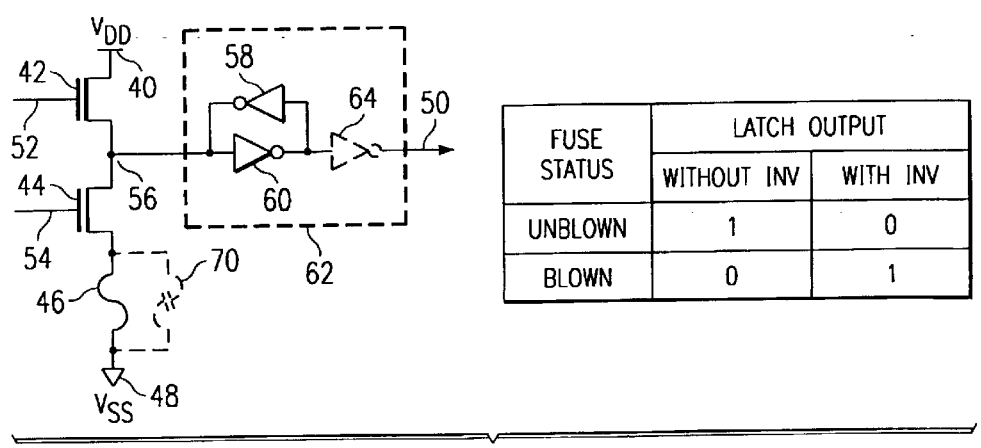
FIG. 2A

FUSE PROGRAMMABLE I/O ORGANIZATION

This patent claims the benefit of U.S. Provisional Patent Application Serial No. 60/308,998, filed on Jul. 31, 2001.

TECHNICAL FIELD

The present invention relates to semiconductor devices such as memory chips and related processes wherein the device may be configured for providing a selected number of input/output channels, and more specifically, the invention relates to methods and circuitry for initially selecting or changing the selection of the input/output channel organization after the semiconductor device has been encapsulated. The features of the invention may also be used to reduce the time required for product testing. For example, the configuration can be preset during fabrication or bond option to the configuration that allows the shortest or most efficient testing. The tested package can when necessary be reconfigured to a customer's requirement according to the teachings of the invention. As used herewith, the term input/output is intended to cover an input configuration only, an output configuration only or configuration which includes both input and output signals. It should also be appreciated that the features of this invention are also applicable to flip-chip packages and flip-chip circuits mounted on a board.

BACKGROUND OF THE INVENTION

As will be recognized by those skilled in the art, it is common to provide basic semiconductor devices such as memory chips which are identical internally, but may be configured to provide various input/output channel configurations. For example, a typical memory chip may be configured to provide 4, 8, 16 or even 32 input/output channels. According to prior art methods, such devices or chips are configured for a specific number of input/output channels by connecting selected bond pads to a $V_{DD}$ (or $V_{ss}$) power source by means of bond wires. Once a chip or semiconductor device is packaged or encapsulated, neither the unused bond pads nor the previously connected bond wires are accessible. Consequently, it is not possible to reconfigure or otherwise change the input/output channel organization or selection.

Unfortunately, an input/output channel selection or organization initially established on a large number of encapsulated semiconductor devices may for various reasons no longer be marketable. Consequently, the chip is often simply destroyed, or at best, sold at a deep discount.

Therefore, it is an objective of the present invention to provide encapsulated semiconductor devices which may allow a choice of selected input/output configurations.

It is another object of the present invention to provide semiconductor devices which have an initial input/output configuration at the time of encapsulation, but which can still be changed to a different input/output configuration after encapsulation.

It is yet another object of the present invention to provide encapsulated semiconductor devices wherein a first input/output configuration is selected after encapsulation and subsequently the selected input/output configuration is changed to a second input/output configuration which is different than the first configuration.

SUMMARY OF THE INVENTION

The methods and circuitry of the invention uses latch fuse circuitry (both regular fuses and anti-fuses) to allow initial input/output channel configuration after encapsulation or reconfiguration from an initial configuration after encapsulation. Furthermore, the features of the invention are also applicable to flip-chip packages and braid mounted flip-chips. According to one embodiment of the invention, fuse latch circuitry provides a selection signal to a x4, x8 or other appropriate selection circuit after encapsulation. The selection signal from the fuse latch circuitry is determined by blowing fuses or anti-fuse to control the selection signal. Other embodiments include parallel circuitry such that a first set of fuse latch circuits can be disabled at the same time as a second set of fuse latch circuits are enabled. This allows for the reconfiguration.

BRIEF DESCRIPTION OF THE DRAWINGS

FIGS. 1a, 1b, and 1c illustrate a prior art chip wherein the input/output configuration is selected for a 16, 8, and a 4, input/output configuration by attaching connecting wires to bond pads.

FIGS. 2a, 2b, 2c and 2d illustrate different embodiments of latch-type fuse and anti-fuse circuits suitable for configuring the input/output channel organization according to the teachings of the present invention.

DETAILED DESCRIPTION OF PREFERRED EMBODIMENTS

Figure 2B:
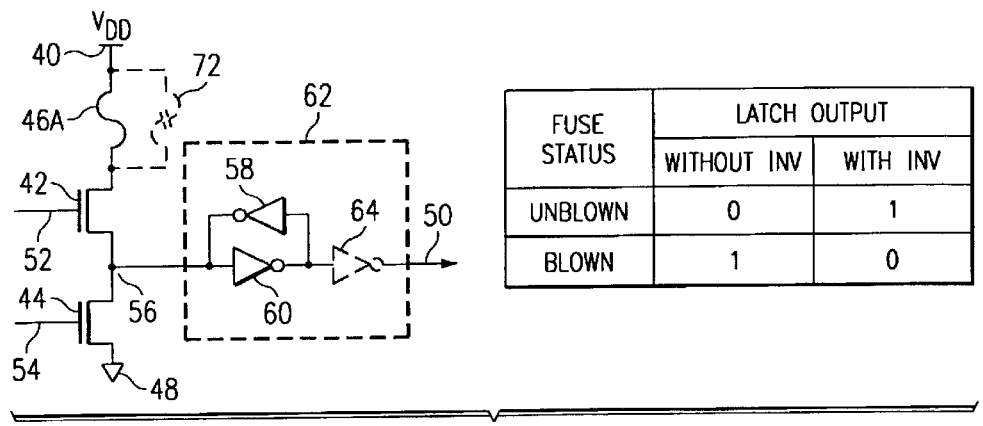

Referring now to FIGS. 1a, 1b and 1c, there is shown the typical prior art configuration wherein a memory chip or other semiconductor device 10 is placed in a "lead frame or substrate" 12 after which bond wires are connected between bond pads such as bond pad 14, 16 and 18 on the chip 10 are connected to individual fingers such as fingers 22, 24, 26 and 28 of the lead frame or substrate 12 as indicated by connecting wire 30. In the embodiment shown in FIG. 1a, there is a single bond wire or connecting lead 30 between finger 22 of the lead frame or substrate 12 and the $V_{DD}$ bond pad 14 such that power is provided from the lead frame or substrate 12 by means of finger 22 through the connecting wire 30 to the $V_{DD}$ bond pad 14 on the chip 10.

In a similar manner, and according to the embodiment of FIG. 1b, the $V_{DD}$ bond pad 14 is connected to finger 22 of lead frame or substrate 12 by connecting wire 30, and includes a further bond wire 32 connected from finger 22 of lead frame or substrate 12 to the bond pad 16. As will be appreciated by those skilled in the art, the configuration of FIG. 1a provides a x16 input/output configuration, whereas the connections of FIG. 1b provide a x8 input/output configuration. In a similar manner and as shown in FIG. 1c, there is a connection wire 34 connected between the x8 bond pad 18 and the lead frame or substrate finger 22 for providing a x4 input/output configuration.

It should be appreciated that although the term "input/output" as used herein does include a semiconductor device wherein both input signals to the device and output signals from the device pass through the input/output channel configuration, the term input/output is also intended to include semiconductor devices where input signals only or output signals only pass through the input/output channel configuration.

However, according to the present invention, the necessity for setting the I/O channel configuration by connecting a wire between the $V_{DD}/V_{SS}$ potential to the appropriate x4 or x8 bond pads may be completely avoided by including latch-type fuse (or anti-fuse), circuits on the semiconductor device or memory chip to selectively connect the $V_{DD}$ (or $V_{SS}$) potential to an input of the x4 or x8 circuitry subsequent to encapsulation or packaging.

As is well known by those skilled in the art, fuse or anti-fuse circuits may be designed to directly deliver an output from the latch circuit having a first polarity or alternatively an inverter may be included at the output of the latch such that an inverted or opposite polarity output is delivered. Consequently, the following diagrams of embodiments cover only few of the many possible circuit arrangements. Other circuit arrangements may readily come to the mind of a person skilled in the art. Therefore, it should be understood that the claims are intended to cover all of the various possible circuit arrangements for connecting a $V_{DD}$ or ($V_{SS}$) potential to x4 or x8 circuitry. To illustrate typical fuse or anti-fuse latching circuits, FIGS. 2a, 2b, 2c and 2d disclose different embodiments. Those portions of the circuits of FIGS. 2a through 2d which include the same elements carried the same reference numbers.

Therefore, as shown in FIG. 2a, there is a $V_{DD}$ input terminal 40 connected to the drain of a positive channel FET 42. The source of the positive channel FET 42 is in turn connected to the drain of a negative channel FET 44. The source of the negative channel FET 44 as is shown is connected to a fuse 46 which in turn is connected to the $V_{SS}$ voltage source terminal 48. According to the circuitry of FIG. 2a, a "1" (one) or positive output is provided on line 50 when the fuse 46 has not been blown, and provides a "0" (zero) or no output on line 50 when the fuse has been blown. For example, the state of the fuse may be stored in the latch when the fuse has not been blown as follows. A first input is provided to the gate 52 of the positive channel FET 42 to initialize the latch. In this situation, there will not be a signal provided to the gate 54 of the negative FET channel 44, and consequently, the transistor 44 represents an open circuit. That is, the transistor is not in a conductive state. Consequently, when the input is applied to gate 52 of transistor 42, transistor 42 becomes conductive, and therefore, the node 56 goes high and initializes the latch output such that after passing the parallel inverters 58 and 60 comprising latch 62, there is a negative, "0" (zero) or no output on line 50. A signal then is applied to the gate 54 of the negative FET (field effect transistor) 44. Consequently, the FET is put into a conductive state such that the node 56 is now driven to the voltage or potential of $V_{SS}$ terminal 48. Consequently, the latch 62 is flipped such that the output on line 50 is a "1" (one) signal. If, of course, fuse 46 had been blown or presented an open circuit, it will be appreciated that the node 56 could not be driven low by the $V_{SS}$ voltage potential, and consequently, the node 56 would remain high which means the output at 50 would be low indicating that the fuse 46 has been blown. It will also be appreciated, that another inverter 64 as shown in dashed lines within latch 62 could be included such that the output would be a "1" (one) or positive when the fuse 46 is blown and a "0" (zero) or a negative when the fuse is not blown. The Table of FIG. 2a shows the output at 68 when an inverter is included and when the inverter is not included.

Referring now to FIG. 2b, there is shown another arrangement of a latching circuit wherein the fuse 46a is between the $V_{DD}$ source terminal 40 and the transistor 42. The operation of this latch is similar to that of FIG. 2a except the signal on gate 54 is applied first to the negative channel FET 44 such that node 56 is originally driven negative and provides a positive "1" (one) output to latch circuit 62. After the signal is applied to gate 54 of the FET 44, a signal is then applied to the gate 52 of positive channel FET 42 which results in the node 56 being driven high when the fuse 46a has not been blown. Consequently, the last state of the latch will be a high input which means there is a "0" (zero) or negative output for the unblown state. Of course, if the fuse 46a had been blown, then node 56 would remain low and the output at line 50 would be positive or a "1" (one). Thus, it is seen in this embodiment, the output would be just the opposite as that of the embodiment of FIG. 2a. Also, as was the case with respect to FIG. 2a, an inverter circuit 64 may be added to the latch circuit such that the outputs provide an opposite status for a blown or unblown fuse. The Table in FIG. 2b shows the latch output with an inverter and without an inverter for the blown and unblown states.

Figure 2C:
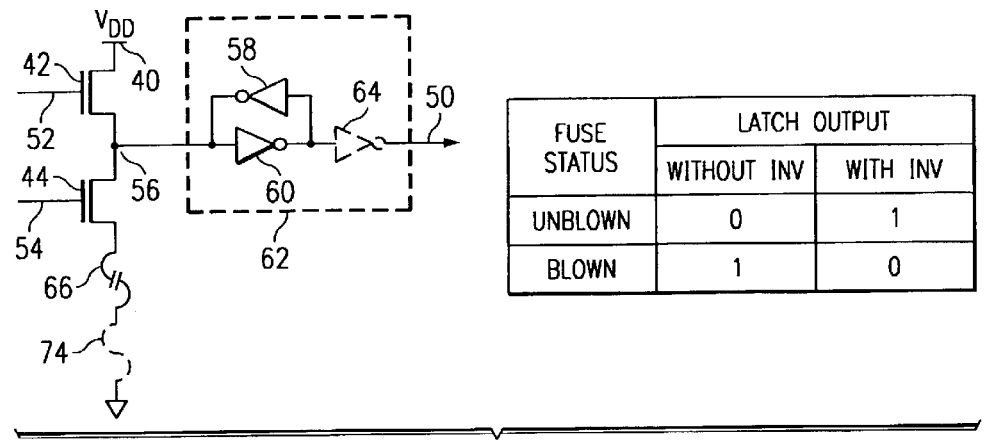
Figure 2D:
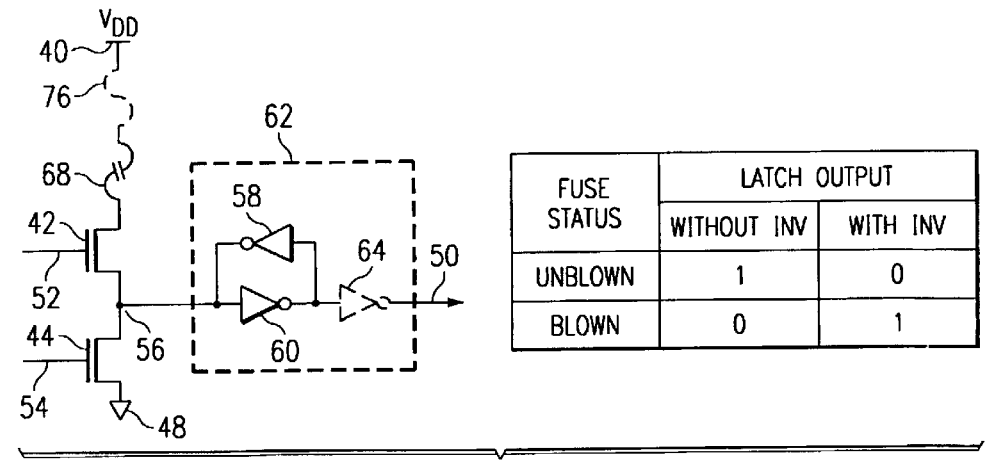

As was also mentioned above, rather than a standard fuse which blows to present an open circuit as shown in FIG. 2c, an anti-fuse 66 may instead be used so that an open circuit is normally presented, but once the anti-fuse is blown, a closed or conductive circuit is presented. According to the operation of the circuit shown in FIG. 2c, the $V_{DD}$ voltage at terminal 40 is initially applied to node 56 by the application of a signal on gate 52 of the positive channel FET 42, which becomes conductive. Then, as was discussed with respect to FIG. 2a, a signal is applied on line 54 to the gate of negative channel FET transistor 44. However, in this embodiment, since the anti-fuse 66 has not been blown or become conductive, node 56 cannot be driven low and therefore remains high. Consequently, since the node 56 is high, the high voltage is presented to latch circuit 62 and the output on line 50 will be low. Thus, when the anti-fuse 66 is not blown, we have a "0" (zero) or negative output on line 50. However, if the anti-fuse 66 is blown, then when an input is applied to gate 54 of the negative channel FET 44, there will be a conductive path through the anti-fuse 66. This drives the node 56 low so as to present a high output on line 50. Also as was discussed in the two examples heretofore, an inverter 64 may be included in the latch circuit 62 such that the polarity of the outputs are reversed. These conditions are shown in the Table included in FIG. 2c showing the status of the output for the unblown or blown fuse with an inverter and without an inverter.

Still another embodiment, similar to that discussed in FIG. 2b, uses an anti-fuse 68 instead of the regular fuse 46a shown in FIG. 2b. The operation procedure for determining the status of this fuse is the same as with respect to 2b except the result will be opposite as shown in the tables FIG. 2d.

It is also possible to use a parallel arrangement of a fuse and an anti-fuse such as anti-fuse 70 and 72 shown in dotted lines in parallel with fuse 46 of FIG. 2a and fuse 46a of FIG.

2b. According to the arrangement, even if the fuse 46 in FIG. 2a were to be blown such that an open circuit is presented between $V_{SS}$ source terminal 48 and node 56, this situation could be reversed by blowing the anti-fuse 70. Similarly, if fuse 46a as shown in FIG. 2b is blown, the circuit can be put back to its original electrical condition by blowing anti-fuse 72. It will be appreciated of course to accomplish this in the simple embodiment illustrated, careful attention must be paid to the voltage applied to the fuses 46 (46a) and the anti-fuse 70 (72). Namely, it should be clear that the current required to blow the regular fuse 46 (46a) must be lower than the current required to blow the anti-fuse 70 (72) to assure that the regular fuse blows first.

Although a parallel fuse/anti-fuse arrangement is preferred, serial arrangements are possible. For example, in the anti-fuse circuits of FIGS. 2c and 2d, regular fuses 74 and 76 shown in dotted lines may be included in series with the anti-fuses 66 and 68. Thus, in this situation, the anti-fuses 66 and 68 are blown and become conductive. Then at a later time, the regular fuse 74 and/or 76 could be blown to put the-circuits into their original condition. However, in this arrangement, it would be necessary that the anti-fuses blow at a lower current than the regular fuses.

Thus, there has been disclosed a myriad of possible fuse/anti-fuse latching circuits which may be used with respect to the present invention. Other arrangements are possible, and will be apparent to those skilled in the art, by using various combinations of parallel and serially connected fuses and anti-fuses.

Figure 3A:
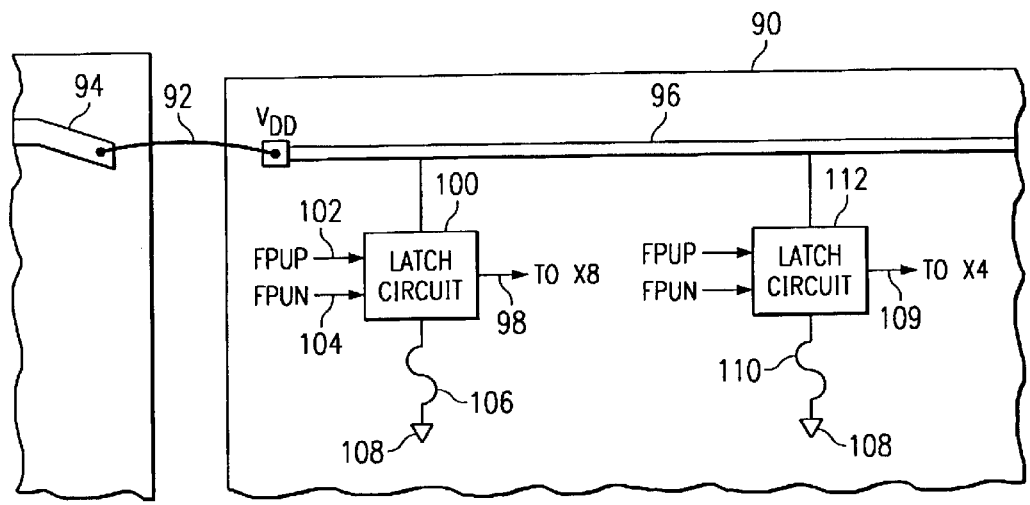
FIGS. 3a and 3b illustrate an embodiment wherein the initial input/output channel organization or configuration is set at x16 by connecting a bond wire to a bond pad, but which can be reconfigured according to the teachings of the present invention.
Figure 3B:
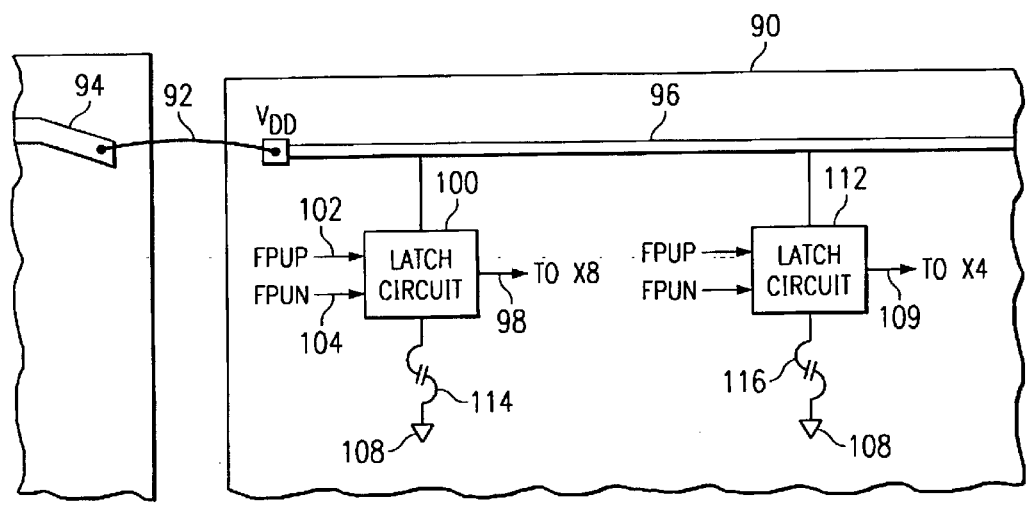

Referring now to FIGS. 3a and 3b, there is shown a typical semiconductor device such as a memory chip 90 having a bond wire connection 92 attached between the $V_{DD}$ potential at lead frame or substrate finger 94 and the $V_{DD}$ bus 96 in the memory chip or other semiconductor device 90. Accordingly, the $V_{DD}$ potential can be connected to the x8 circuitry as indicated by the output line 98 from fuse latch circuit 100. In addition to a connection from the $V_{DD}$ bus 96 to latch circuit 100, there are also shown control signals FPUP and the FPUN signals on lines 102 and 104, respectively. The control signals on lines 102 and 104 are similar to the gate signals 52 and 54 discussed above with respect to FIGS. 2a, 2b, 2c and 2d. Also, as shown in this embodiment, there is shown a normal type fuse 106 connected between the source potential $V_{SS}$ at terminal 108 and latch circuit 100. Similarly, the $V_{DD}$ potential can be connected to the x4 circuitry as indicated by output line 109 by blowing fuse 110 connected to latch circuit 112.

Thus, it will be appreciated that the embodiment shown in FIG. 3a is illustrated as one including a pair of latch circuits of the type such as shown in FIG. 2a. Of course, as was discussed above, various types of different latch circuits using fuses and anti-fuses may be used for this purpose.

For example, FIG. 3b is similar to that of FIG. 3a, but illustrates embodiments using anti-fuses 114 and 116 in the arrangement of FIG. 2c rather than a regular fuse for providing the selection of x4 or x8 input/output configuration.

Consequently, from FIGS. 3a and 3b, it is seen that a single bond pad 94 on the lead frame or substrate having the normal $V_{DD}$ potential may be connected to the usual $V_{DD}$ bond pad on memory chip 90 such that the chip initially has an input/output configuration of x16, and then by blowing the appropriate fuse or anti-fuse such as fuse 106 or anti-fuse 114, the configuration can be changed to a x8 configuration. Alternatively, by blowing the fuse 110 or anti-fuse 116 shown in FIG. 3b circuitry, the x4 input/output configuration may be selected. It should be appreciated that the technique may be used to reduce product-testing time by configuring the input/output selection to that configuration which allows the fastest or most efficient testing. The tested product can then be recognized in response to a customer's requirement.

Figure 4:
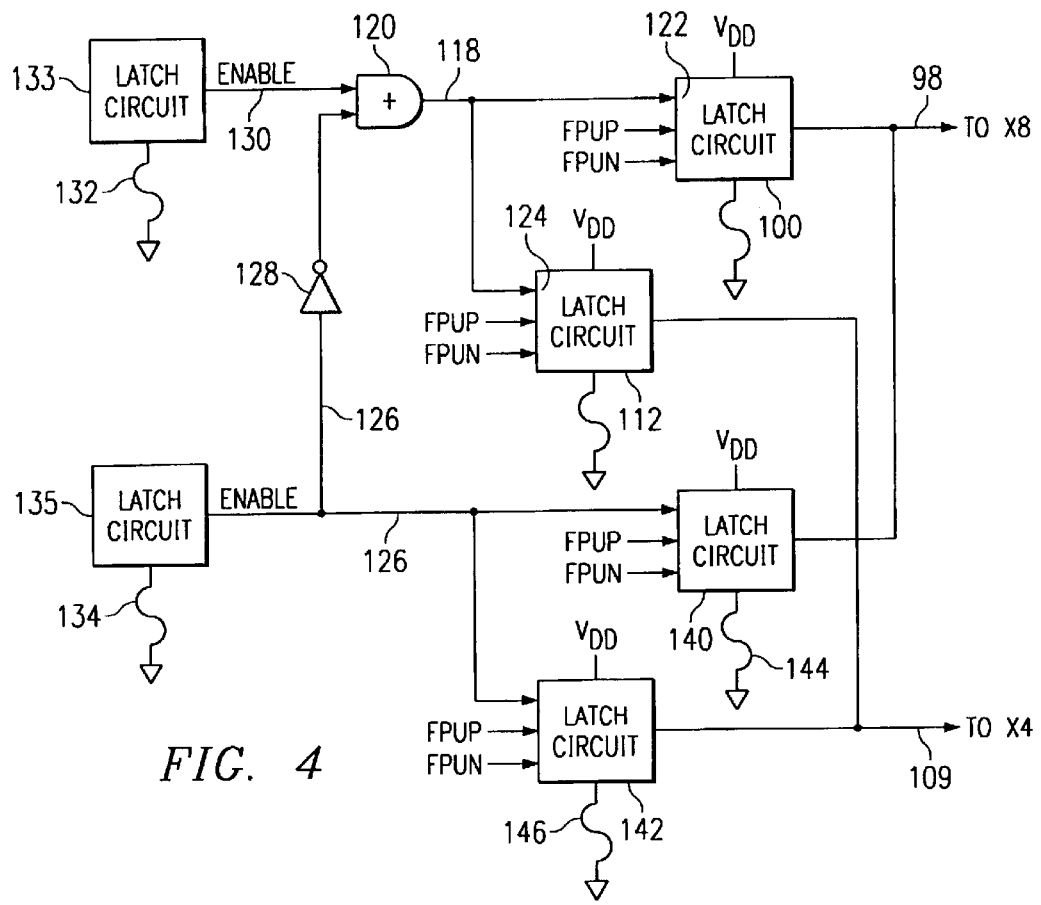
FIG. 4 illustrates an embodiment of the present invention wherein the input/output channel organization is selected and set after encapsulation of the semiconductor device in response to a customer's order, but which can be reconfigured for different usage at a later date.

Referring now to FIG. 4, there is shown an embodiment using a latch circuit for each of the x8 and x4 connections. As will be discussed, according to this arrangement, the input/output organization may initially be set by using electrical fuses or anti-fuses in a manner discussed heretofore, and then a second set of fuses allows the original or initial setting to be overridden at any suitable time in the future for different uses. According to this embodiment, circuitry similar to that discussed above with respect to FIGS. 3a and 3b further includes an input enable/disable signal on line 118 from AND gate 120. The requirement of an enable signal on line 118 means the latch circuits 100 and 112 will be disabled in this embodiment until the appropriate positive signal is received at the latch input 122 and 124 on the x8 and x4 latch circuits, respectively. As shown, initially there will be no voltage on line 126 at the input of inverter 128 which of course means the inverter provides a positive output. Consequently, one of the inputs to the AND gate 120 will always be positive until a positive signal is received online 126. Thus, it is seen that initially there is always one of the two inputs into AND gate 120 that will be positive. All that is needed therefore is for the other signal or the enable signal on line 130 to a changed state to positive to get an output on line 118 from AND gate 120.

Therefore, when it is time to select the input/output channel configuration for the semiconductor circuit, all that is necessary is for the fuse 132 of latch circuit 133 to be blown which will result in a positive output on line 130 which is provided to AND gate 120. To accomplish this, as an example only, latch circuit 133 could be configured the same as the latch circuit of 2a while also including an inverter such as inverter 64 to provide a "0" (zero) output when the circuit is unblown and a "1" (one) output when the fuse is blown. Alternatively, the circuit of 2b without an inverter could be chosen as could the anti-fuse circuitry of FIG. 2c without an inverter or the anti-fuse circuitry of 2d with an inverter. In any event, it is seen that once a positive output is provided on line 130 to AND gate 120, there will be a positive output on line 118 to enable latch circuits 100 and 112 for selecting the x4 or x8 input/output configuration. Once enable, the latch circuits 100 and 112 operate in the same manner as discussed above with respect to FIG. 3a to select a x8 or x4 input/output channel configuration. Similarly, it should now be clear that anti-fuse circuits could also be used for determining the input/output configuration in a manner discussed previously.

However, if at some time, subsequent to the selection of input/output channel circuits by latch circuits 100 and 112, it is desirable to change the number of input/output channels, all that is necessary is that the fuse 134 of latch circuit 135 be blown so as to change the output on lines 126 from a "0" (zero) or negative output to a positive or "1" (one) output. When the signal on line 126 goes positive, the inverter circuitry 128 will provide a "0" input to the AND gate 120 such that the output on line 118 goes negative. This is of course because an AND gate requires all of the inputs to be "1" for a positive or "1" (one) output signal. Consequently, the signal from inverter 128 will now be a "0" (zero) or no signal. At the same time, however, when the signal on line 126 goes positive, the x8 latch circuit 140 and the x4 latch circuit 142 become enable. Consequently, since the latch circuits 100 and 110 have been disable and the latch circuits 140 and 142 have now been enable, the appropriate x4 or x8 input/output channel selection circuitry may be activated by blowing the appropriate fuse 144 and/or 146. Further, as was discussed above, any type of latch-type fuse or anti-fuse circuit discussed above is appropriate for providing the signals out on lines 98 and 109.

Thus, there has been discussed to this point with respect to FIG. 4, circuitry which allows a first selection of an input/output channel which can then be changed at a later time to another selection of input/output channel which may be the same or different than that selected during the first process.

Figure 5:
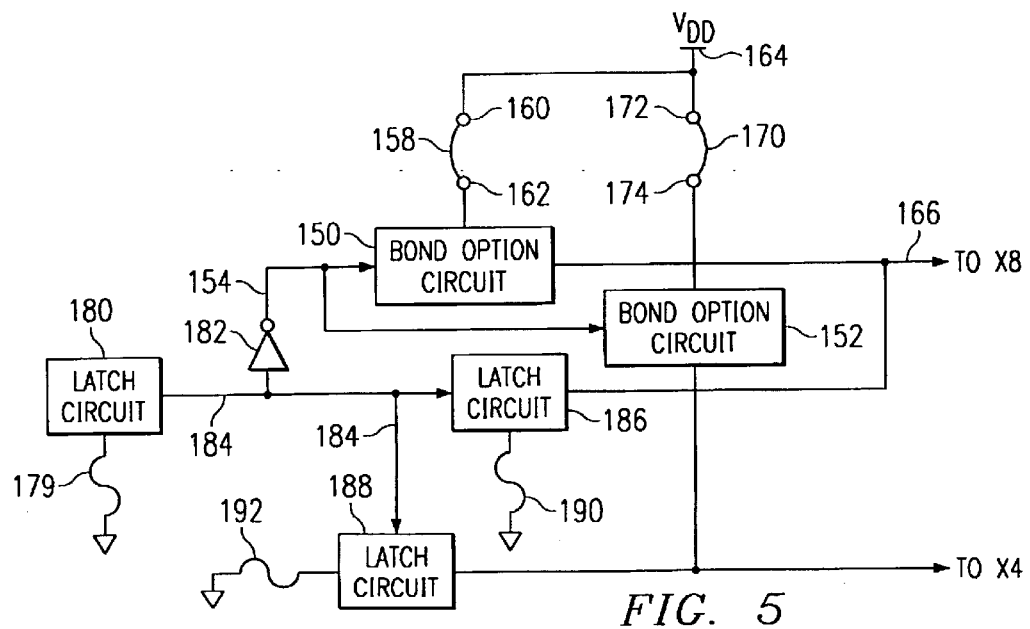
FIG. 5 illustrates another embodiment of the invention wherein the original input/output configuration is set according to the prior art by connecting bond wires to bond pads. The configuration can then be changed by disabling the bond option configuration and enabling a latch circuit Corresponding numerals and symbols in the different figures refer to corresponding parts unless otherwise indicated. The figures are drawn to clearly illustrate the relevant aspects of the preferred embodiments, and are not necessarily drawn to scale.

Referring now to FIG. 5, there is shown still another embodiment of the present invention which is a combination of the Figures discussed with respect to FIGS. 1, 3 and 4. According to this embodiment, bond option circuits 150 and 152 initially receive a positive or "1" (one) signal on line 154 which enables both of the bond option circuits 150 and 152 to be available for selecting x4 or x8 circuitry. $V_{DD}$ potential may be applied to the bond option circuit 150 by connecting a bond wire 158 between terminals 160 and 162. Bond option circuit 150 may be any suitable switching circuit such as for example only, a field effect transistor. Therefore, when an enable signal is applied to its gate, the transistor becomes conductive so that the $V_{DD}$ potential at 164 passes through the FET and out on line 166 to the x8 circuitry. Likewise, if a connecting wire 170 is attached between the bond pads 172 and 174, a potential is now applied to the bond option circuit 152 such that when the enable signal is received, a conductive path is provided to the bond option circuit so as to provide an output 178 to the x4 circuitry on line 176. Then, in a similar manner as discussed with respect to fuses 132 and 134 in FIG. 4a, if fuse 179 is blown, latch circuit 180 will be flipped such that its output is now positive or a "1" (one) which of course disables bond option circuits 150 and 152 by means of inverter 182 changing from a positive output to a negative output. At the same time, the positive signal on line 184 enables latch circuits 186 and 188 so that the appropriate x4 or x8 output to select the number of input/output channels may be activated by blowing the x8 fuse 190 or the x4 fuse 192. Thus, according to this embodiment, the initial input/output channel selection is accomplished in a typical prior art manner by connecting a bond wire between a $V_{DD}$ or $V_{SS}$ voltage potential to the appropriate bond pad. However, according to the present invention, the initial selected input/output channels may be reselected at a later time by disabling the bond option circuit 150 and 152 enabling the fuse or anti-fuse latch circuits 186 and 188. Again, as was mentioned above, the initial configuration may be selected to provide the fastest product testing, and then when necessary, the circuit is reconfigured to meet the customer's needs.

Thus, there has been described various embodiments according to the present invention methods and apparatus for selecting or reselecting input/output channels are connections without the use of bond wires or bumps and after encapsulation of the semiconductor device or memory chip. The methods and apparatus are equally applicable to flip-chip packages and flip-chips already mounted on a circuit board.

What is claimed is:

1. In a semiconductor circuitry, having the number of available I/O (input/output) channels selected by bond-pad connections, circuitry for changing the initial selected number of I/O channels comprising:
   at least one bond-option circuit coupled to a voltage potential and having an enable/disable input, and an output signal coupled to I/O channel selection bond-pad;
   at least one latch fuse circuit coupled to a voltage potential and having an enable/disable input, and an output signal connected to said I/O channel selection bond-pad;
   said at least one latch fuse circuit further connected to receive an enable signal when said at least one bond-option circuit receives a disable signal, and to receive a disable signal when said at least one bond-option circuit receives an enable signal; and
   an enable latch fuse circuit having a fuse, said enable latch fuse circuit for providing one of the enable/disable inputs to said at least one bond-option circuit and providing the other one of said enable/disable signals to said at least one latch fuse circuit when said fuse in said enable latch fuse circuit is not blown, and providing said one of the enable/disable inputs to said at least one latch fuse circuits and providing said other one of the enable/disable inputs to said at least one bond-option circuit when said fuse in said enable latch fuse circuit is blown.

2. The circuitry of claim 1 and further comprising an inverter circuit connected between said enable latch fuse circuit and one of said at least one bond-option circuit and at least one fuse circuit.

3. In the circuitry of claim 2 wherein said at least one latch fuse circuit comprises two latch fuse circuits connected one each to different I/O channels select bond-pads and each at least one bond-option circuit comprises two bond-option circuits connected one each to different I/O channel selection bond-pads.

4. The circuitry of claim 3 wherein said at least one latch fuse circuit comprises an ordinary fuse which provides an open circuit when blown.

5. The circuitry of claim 4 and further comprising an anti-fuse in parallel with each at least one ordinary fuse such that each open circuit can be reversed by blowing the appropriate parallel anti-fuse.

6. The circuitry of claim 3 wherein said at least one latch fuse circuit comprises an anti-fuse for providing a conductive circuit when said fuse is blown.

7. The circuitry of claim 2 wherein said at least one latch fuse circuitry comprises ordinary fuse which provides an open circuit when blown.

8. The circuitry of claim 7 and further comprising an anti-fuse in parallel with each at least one ordinary fuse such that each open circuit can be reversed by blowing the appropriate parallel anti-fuse.

9. The circuitry of claim 2 wherein said at least one latch fuse circuit comprises an anti-fuse for providing a conductive circuit when said fuse is blown.

10. The circuitry of claim 2 wherein said at least one latch fuse circuit further comprises a fuse and a latching circuit operating such that when said fuse in said latch fuse circuit is not blown, one of a high and low signal is provided to an I/O channel selection bond-pad, and when said fuse in said latch fuse circuit is blown, the other one of said high and low signal is provided to said I/O channel selection bond pad.

11. In the circuitry of claim 1 wherein said at least one latch fuse circuit comprises two latch fuse circuits coupled one each to different I/O channels select bond-pads and each said at least one bond-option circuit comprises two bond-option circuits connected one each to different I/O channel selection bond-pads.

12. The circuitry of claim 11 wherein said at least one latch fuse circuit comprises an ordinary fuse which provides an open circuit when blown.

13. The circuitry of claim 12 and further comprising an anti-fuse in parallel with each at least one ordinary fuse such that each open circuit can be reversed by blowing the appropriate parallel anti-fuse.

14. The circuitry of claim 11 wherein said at least one latch fuse circuit comprises an anti-fuse for providing a conductive circuit when said fuse is blown.

15. The circuitry of claim 1 wherein said at least one latch fuse circuit comprises an ordinary fuse which provides an open circuit when blown.

16. The circuitry of claim 15 and further comprising an anti-fuse in parallel with each at least one ordinary fuse such that each open circuit can be reversed by blowing the appropriate parallel anti-fuse.

17. The circuitry of claim 15 wherein said at least one latch fuse circuit further comprises a latching circuit operating such that when said fuse is not blown, one of a high and low signal is provided to an I/O channel selection bond-pad, and when said fuse is blown, the other one of said high and low signal is provided to said I/O channel selection bond pad.

18. The circuitry of claim 1 wherein said at least one latch fuse circuit comprises an anti-fuse for providing a conductive circuit when said fuse is blown.

19. The circuitry of claim 18 wherein said at least one latch fuse circuit further comprises a latching circuit operating such that when said fuse is not blown, one of a high and low signal is provided to an I/O channel selection bond-pad, and when said fuse is blown, the other one of said high and low signal is provided to said I/O channel selection bond pad.

20. The circuitry of claim 1 wherein said at least one latch fuse circuit further comprises a fuse and a latching circuit operating such that when said fuse in said latch fuse circuit is not blown, one of a high and low signal is provided to an I/O channel selection bond-pad, and when said fuse in said latch fuse circuit is blown, the other one of said high and low signal is provided to said I/O channel selection bond pad.

21. The circuitry of claim 1 wherein signals passing through said input/output channels comprises any one of input signals only to said circuitry, output signals only from said circuitry and both input signals to said circuitry and output signals from said circuitry.

22. The circuitry of claim 1 wherein said semiconductor circuitry is a memory device.

23. Semiconductor circuitry having a selectable number of I/O channels comprising:
at least one selection input for receiving a signal for selecting a predetermined number of I/O channels; and
at least one fuse circuit having a fuse for providing said signal for selecting when said fuse is in one of a blown and unblown condition, and not providing said signal for selecting when said fuse is in the other one of said blown and unblown condition and a latching circuit to store the state of said fuse.

24. The circuitry of claim 23 wherein said at least one selection input comprises two selection inputs, and said at least one fuse circuit comprises two fuse circuits, said two fuse circuits coupled one each to said two select inputs.

25. The circuitry of claim 24 wherein each of said two fuse circuits further comprises a latching circuit.

26. The circuitry of claim 25 wherein said fuse circuitry comprises an anti-fuse for providing a conductive circuit when said anti-fuse is blown.

27. The circuitry of claim 25 and further comprising an inverter circuit connected between each of said two latching circuits and each of said two selection inputs.

28. The circuitry of claim 24 wherein said fuse circuitry comprises an ordinary fuse for providing an open circuit when blown.

29. The circuitry of claim 24 wherein said fuse circuitry comprises an anti-fuse for providing a conductive circuit when said anti-fuse is blown.

30. The circuitry of claim 24 and further comprising an inverter circuit connected between each of said two fuse circuits and each of said two selection inputs.

31. The circuitry of claim 23 wherein said fuse circuitry comprises an ordinary fuse for providing an open circuit when blown.

32. The circuitry of claim 23 wherein said fuse circuitry comprises an anti-fuse for providing a conductive circuit when said anti-fuse is blown.

33. The circuitry of claim 23 and further comprising an inverter circuit connected between said at least one fuse circuit and said at least one selection input.

34. The circuitry of claim 23 wherein at least one fuse circuit comprising at least one ordinary fuse for providing an open circuit when blown and an anti-fuse for providing a conductive circuit when blown.

35. The circuitry of claim 23 wherein signals passing through said input/output channels comprises any one of input signals only to said circuitry, output signals only from said circuitry and both input signals to said circuitry and output signals from said circuitry.

36. The circuitry of claim 23 wherein said semiconductor circuitry is a memory device.

37. Semiconductor circuitry having a selected number of I/O channels wherein said selected number of I/O channels may be changed to a different number, said semiconductor circuitry comprising:
a selection signal for selecting a predetermined number of I/O channels;
at least two pairs of fuse circuits, each fuse circuit of said at least two pairs including a fuse and coupled to receive an enable signal and for providing said signal for selecting when its fuse is in one of a blown and unblown condition and not providing said signal for selecting when its fuse is in the other one of a blown and unblown condition;
a first fuse enable circuit having a fuse for providing a first enable signal when its fuse is in one of a blown and unblown condition, and for not providing said first enable signal when its fuse is in the other one of a blown and unblown condition;
a second fuse enable circuit having a fuse for providing a second enable signal to one enable pair of said fuse circuits when said fuse of said second fuse enable circuit is in one of a blown and unblown condition, and for not providing said second enable signal when said fuse of said second fuse enable circuit is in the other one of a blown and unblown condition;
an inverter circuit coupled to receive said second enable signal from said second fuse circuit said inverter circuit providing an enabling output when said second enable signal is not present and not providing said enabling output when said second enable signal is present; and
a logic gate for receiving said first enable signal from said first fuse enable circuit and for receiving said enabling signal from said inverter circuit, said logic gaze providing an enable signal to enable the other pair of said fuse circuits when said signals from said first fuse enable circuit and said inverter circuit are present.

38. The circuitry of claim 37 wherein said memory chip is encapsulated before selection of an input/output configuration.

39. The circuitry of claim 37 wherein signals passing through said input/output channels comprises any one of input signals only to said circuitry, output signals only from said circuitry and both input signals to said circuitry and output signals from said circuitry.

40. The circuitry of claim 37 said semiconductor circuitry is a memory device.

41. A method of providing semiconductor circuitry having a number of I/O channels selectable by a user comprising:
   providing a multiplicity of semiconductor circuits, each semiconductor circuit comprising at least one fuse circuit, each of said at least one fuse circuit including a fuse and for providing a selected output signal when its fuse is blown;
   blowing the fuse on said at least one fuse circuit on each semiconductor circuit to provide a signal for selecting the number of I/O channels; and
   storing whether the fuse in each of said at least one fuse circuit has been blown or has not been blown.

42. The method of claim 41 wherein said multiplicity of provided semiconductor circuits have a preset selected number of I/O channels, and said step of blowing at least one fuse, selects another number of I/O channels different than said preset selected number.

43. The method of claim 42 and comprising the step of encapsulating said semiconductor circuit prior to said blowing step.

44. The method of claim 42 wherein said step of blowing at least one fuse further comprises inverting the output of a latch circuit for providing said signal for selecting the number of I/O channels.

45. The method of claim 42 wherein said step of blowing at least one fuse comprises blowing at least one fuse which provides an open circuit when said fuse is blown.

46. The method of claim 42 wherein said step of blowing at least one fuse comprises blowing at least one anti-fuse for providing a closed connection when said anti-fuse is blown.

47. The method of claim 42, wherein said preset number of I/O channels is selected to require the lowest test time, and said step of blowing at least one fuse selects the number of I/O channels required by a customer.

48. The method of claim 41 wherein said step of blowing comprises blowing a fuse in a first enable circuit to enable a first set of fuse circuits for selecting and then blowing selective fuses of said first set of fuse circuits to select the number of I/O channels.

49. The method of claim 48 and further comprising:the step of blowing a fuse in a second enable circuit to disable said first set of fuse circuits for selecting and enabling a second set of fuse circuits for selecting; and
   blowing selected fuses of said second set of fuse circuits to select a different number of I/O channels.

50. The method of claim 49 and further comprising the step of encapsulating said semiconductor circuit prior to said blowing step.

51. The method of claim 49 wherein said step of blowing at least one fuse comprises blowing at least one fuse which provides an open circuit when said fuse is blown.

52. The method of claim 49 wherein said step of blowing at least one fuse comprises blowing at least one anti-fuse for providing a closed connection when said anti-fuse is blown.

53. The method of claim 49, where the step of blowing selected fuses of said first set of fuses provides product configuration requiring the lowest test time, and the step of blowing selected fuses of said second set provides a required configuration.

54. The method of claim 41 and further comprising the step of encapsulating said semiconductor circuit prior to said blowing step.

55. The method of claim 54 wherein said step of blowing at least one fuse comprises blowing at least one fuse which provides an open circuit when said fuse is blown.

56. The method of claim 48 wherein said step of blowing at least one fuse comprises blowing at least one anti-fuse for providing a closed connection when said anti-fuse is blown.

57. The method of claim 54 wherein said step of blowing at least one fuse comprises blowing at least one anti-fuse for providing a closed connection when said anti-fuse is blown.

58. The method of claim 48 wherein said step of blowing at least one fuse comprises blowing at least one fuse which provides an open circuit when said fuse is blown.

59. The method of claim 48 and further comprising the step of encapsulating said semiconductor circuit prior to said blowing step.

60. The method of claim 41 wherein said step of blowing at least one fuse comprises blowing at least one fuse which provides an open circuit when said fuse is blown.

61. The method of claim 41 wherein said step of blowing at least one fuse comprises blowing at least one anti-fuse for providing a closed connection when said anti-fuse is blown.

62. The method of claim 41 wherein said input/output channels are for passing any one of input signals only to said semiconductor circuit, output signals only from said semiconductor circuit and both input signals to said semiconductor circuit and output signals from said semiconductor circuit.

63. The method of claim 41 wherein said semiconductor circuitry is a memory device.

* * * * *

UNITED STATES PATENT AND TRADEMARK OFFICE
CERTIFICATE OF CORRECTION

PATENT NO. : 6,707,746 B2
DATED : March 16, 2004
INVENTOR(S) : Frankowsky et al.

It is certified that error appears in the above-identified patent and that said Letters Patent is hereby corrected as shown below:

Column 10,
Line 59, delete "gaze" and insert -- gate --.

Signed and Sealed this

Twelfth Day of October, 2004

JON W. DUDAS
*Director of the United States Patent and Trademark Office*